(12) United States Patent
Fukuda et al.

(10) Patent No.: US 7,648,576 B2
(45) Date of Patent: Jan. 19, 2010

(54) EPITAXIAL WAFER AND METHOD FOR PRODUCING SAME

(75) Inventors: Yasuo Fukuda, Tokyo (JP); Makoto Takemura, Tokyo (JP); Koichi Okuda, Tokyo (JP)

(73) Assignee: SUMCO Corporation, Tokyo (JP)

( * ) Notice: Subject to any disclaimer, the term of this patent is extended or adjusted under 35 U.S.C. 154(b) by 534 days.

(21) Appl. No.: 10/596,280

(22) PCT Filed: Dec. 10, 2004

(86) PCT No.: PCT/JP2004/018512

§ 371 (c)(1),
(2), (4) Date: Jun. 8, 2006

(87) PCT Pub. No.: WO2005/057640

PCT Pub. Date: Jun. 23, 2005

(65) Prior Publication Data

US 2007/0093072 A1    Apr. 26, 2007

(30) Foreign Application Priority Data

Dec. 11, 2003    (JP) .............................. 2003-413737

(51) Int. Cl.
*C30B 5/00*    (2006.01)
*H01L 21/311*    (2006.01)

(52) U.S. Cl. .............................. 117/9; 117/17; 117/43; 117/97; 438/680; 438/695; 438/706; 438/734; 438/745; 438/764; 438/905; 438/913

(58) Field of Classification Search ...... 117/9, 117/43, 17, 97; 438/695, 706, 734, 913, 438/905, 680, 773, 745, 764
See application file for complete search history.

(56) References Cited

U.S. PATENT DOCUMENTS 5,308,788 A * 5/1994 Fitch et al. .................... 117/86

(Continued)

FOREIGN PATENT DOCUMENTS

JP    7-86220    3/1995

(Continued)

OTHER PUBLICATIONS

Semiconductor Silicon Crystal Technology, "VLSI Handbook," Academic Press; 1985, pp. 125-128, including a partial English translation.

(Continued)

*Primary Examiner*—Robert M Kunemund
*Assistant Examiner*—G. Nagesh Rao
(74) *Attorney, Agent, or Firm*—Greenblum & Bernstein, P.L.C.

(57) ABSTRACT

After cleaning the front and back sides of a silicon wafer with a liquid SC-1 and liquid SC-2, the front and back sides of the silicon wafer are cleaned with an HF solution to be water-repellent surfaces. Following that, an epitaxial layer of silicon is formed on the front side. Consequently, there can be reduced stacking faults after formation of the epitaxial layer and occurrence of cloud on the back side. Alternatively, the front and back sides of a silicon wafer are cleaned with the liquid SC-1 and liquid SC-2, and then the back side of the silicon wafer is cleaned with an HF solution to be a water-repellent surface while the front side is cleaned with purified water to be a hydrophilic surface. Following that, an epitaxial layer of silicon is formed on the front side. Consequently, there can be reduced mounds on the front side and occurrence of cloud on the back side.

8 Claims, 4 Drawing Sheets

U.S. PATENT DOCUMENTS

| | | | |
|---|---|---|---|
| 5,863,808 A * | 1/1999 | Tsunoda | 438/18 |
| 6,037,270 A * | 3/2000 | Kageyama et al. | 438/746 |
| 6,107,197 A | 8/2000 | Suzuki | |
| 6,239,045 B1 * | 5/2001 | Tanaka et al. | 438/507 |
| 6,277,657 B1 | 8/2001 | Nozawa et al. | |
| 6,376,395 B2 * | 4/2002 | Vasat et al. | 438/795 |
| 6,454,852 B2 * | 9/2002 | Dietze et al. | 117/29 |
| 6,563,133 B1 * | 5/2003 | Tong | 257/52 |
| 6,942,737 B2 * | 9/2005 | Sato | 134/6 |
| 7,105,055 B2 * | 9/2006 | Ferro et al. | 117/84 |
| 7,341,065 B2 * | 3/2008 | Verhaverbeke et al. | 134/1.3 |
| 2001/0007240 A1 * | 7/2001 | Dietze et al. | 117/11 |
| 2002/0004305 A1 * | 1/2002 | Vasat et al. | 438/690 |
| 2003/0008475 A1 * | 1/2003 | Cheung et al. | 438/455 |
| 2003/0036268 A1 * | 2/2003 | Brabant et al. | 438/689 |
| 2003/0060126 A1 * | 3/2003 | Mikhaylich et al. | 451/5 |
| 2003/0141502 A1 * | 7/2003 | Tong | 257/52 |
| 2006/0156970 A1 * | 7/2006 | Dong-Suk et al. | 117/97 |
| 2006/0261038 A1 * | 11/2006 | Verhaverbeke et al. | 216/83 |

FOREIGN PATENT DOCUMENTS

| | | |
|---|---|---|
| JP | 08-078326 | 3/1996 |
| JP | 9-190979 | 7/1997 |
| JP | 11-16844 | 1/1999 |
| JP | 11-111661 | 4/1999 |
| JP | 2000-31071 | 1/2000 |
| JP | 2000-91240 | 3/2000 |
| JP | 2000-288490 | 10/2000 |
| JP | 2003-1199 | 1/2003 |
| JP | H2003-182615 | 7/2003 |
| WO | 02/097864 | 12/2002 |

OTHER PUBLICATIONS

English Language Abstract of JP 11-16844.
English Language Abstract of JP 11-111661.
English Language Abstract of JP 2000-288490.
English Language Abstract of JP 2003-1199.
English Language Abstract of JP 08-078326.
English Language Abstract of JP H2003-182615.

* cited by examiner

EPITAXIAL WAFER AND METHOD FOR PRODUCING SAME

FIELD OF THE INVENTION

The present invention relates to an epitaxial wafer and a method for producing the same, and more specifically to an epitaxial wafer comprising an epitaxial film formed over a top surface of a silicon wafer and a method for producing the same.

DESCRIPTION OF THE PRIOR ART

An epitaxial wafer is a type of wafer having an epitaxial film deposited over a top surface of a silicon wafer, which film has been formed in the epitaxial growth. Recently, in conjunction with high-density integration in MOS memory devices, there are emerging some problems including a malfunction of a memory due to an α-particle (i.e., a soft error) and a latch up phenomenon in a CMOS IC, which are no more negligible. It has been recognized that the epitaxial wafer having the epitaxial film is effective to address those problems, and in a recent trend, the epitaxial wafer is employed positively in the production of the CMOS IC.

Cleaning process to be performed prior to the film deposition of the epitaxial film is typically accomplished by an alkali cleaning represented by the cleaning with a solution of $H_2O_2/NH_4OH$ and an acid cleaning represented by the cleaning with a solution of $H_2O_2/HCl$, as described in a cited reference, Non-patent Document 1. This cleaning process can remove particles and metal impurities present in the top and the back surfaces of the silicon wafer.

In addition, those cleaning steps are performed by using a batch processing type of cleaning equipment enabling the cleaning process by each dozens of wafers. The cleaning by using the batch processing type of cleaning equipment provides an advantage that both the top and back surfaces of the silicon wafer can be cleaned in a short time.

[Non-patent Document 1]

Edited by Fumio Shimura, "*Engineering of Semiconductor Silicon Crystal*", First edition, Japan, Maruzen Co., Ltd., published in Sep. 30, 1993, pp. 125-128

If the batch processing type of cleaning equipment described above is used to clean the silicon wafer with the above-described cleaning solution, a native oxide film resultant from the solution would remain on the silicon wafer. In this stage, a thickness of the native oxide film is 15 Å. The hydrogen baking prior to the epitaxial film deposition is then applied to the silicon wafer having the native oxide film formed therein. This causes the native oxide film on the surface of the silicon wafer to react with the hydrogen and thus be etched.

However, during the hydrogen baking, the back surface of the silicon wafer is in contact with a suscepter. In addition, there is the poor hydrogen gas flow from the outermost peripheral region toward the back surface of the silicon wafer. Those conditions inhibit the native oxide film remaining in the contact region between the silicon wafer back surface and the suscepter and in the outermost peripheral region of the silicon wafer from being etched. Unfortunately, the native oxide film remaining in the above-described respective regions remains as roughened. Consequently, this would turn to be cloudy and whity blur or tarnish (hereinafter referred to as cloud) appearing in the above-described respective regions of the silicon wafer after the mirror finishing.

Further, the native oxide film can be occasionally found remaining in the top surface of the silicon wafer, as well. If the epitaxial film is deposited on the top surface of the silicon wafer as it is in the condition as described above, an atomic arrangement of silicon could be collapsed, leading to a stacking fault.

In addition, if using the batch processing type of cleaning equipment described above, owing to the cleaning fluid having turned dirty due to a large number of silicon wafers dipped in the cleaning fluid, possibly the particles and the like could remain on the surface of the silicon wafer. If subsequently the epitaxial film is deposited on the surface of the silicon wafer as in the condition described above, a mound could be generated, as it grows abnormally around the foreign particle, on the surface of the epitaxial wafer. The stacking fault as well as the mound may lead to malfunctioning in the production of the devices.

SUMMERY OF THE INVENTION

Problem To Be Solved By The Invention

The present invention has been made in the light of the problems as pointed above, and an object thereof is to provide a method for producing an epitaxial wafer with the number of development of the mound and the stacking fault having been successfully reduced, which would otherwise lead to the malfunctioning in the production of devices.

Another object of the present invention is to provide a method for producing an epitaxial wafer, wherein the development of tarnish can be inhibited, which could otherwise appear in a circle in the back surface of the epitaxial wafer.

Yet another object of the present invention is to provide a method for producing an epitaxial wafer, which allows a varied control to be given such that the top and the back surfaces of the silicon wafer can be independently processed to be in each different condition.

Means To Solve The Problem

A first invention provides a method for producing an epitaxial wafer by depositing a film of epitaxial layer through an epitaxial growth over a top surface of a silicon wafer, comprising: a first cleaning step for cleaning a top and a back surfaces of the silicon wafer with a SC-1 liquid and a SC-2 liquid; a second cleaning step, after the first cleaning step, for cleaning the back surface of the silicon wafer to be a water repellent surface; and a third cleaning step for cleaning the top surface of the silicon wafer to be a water repellent surface, wherein after the three steps of cleaning having been finished, the film of epitaxial layer is deposited through the epitaxial growth over the top surface of the silicon wafer.

Prior to the film deposition of epitaxial layer through the epitaxial growth over the top surface of the silicon wafer, the first to the third cleaning steps are performed.

The first cleaning step provides the cleaning of the top and the back surfaces of the silicon wafer with the SC-1 liquid and the SC-2 liquid. The SC(Standard Cleaning)-1 liquid is a mixture of an aqueous ammonia solution ($NH_4OH$), a hydrogen peroxide solution ($H_2O_2$) and water ($H_2O$). Besides, the SC-2 liquid is a mixture of an aqueous hydrochloric acid solution (HCl), a hydrogen peroxide solution ($H_2O_2$) and water ($H_2O$).

The second cleaning step provides the cleaning intended to make the back surface of the silicon wafer into a water repellent surface. The cleaning enabling the resultant water repellent surface may include a cleaning with HF solution or BHF solution, for example. Further, $O_3$ water (ozone water) may be used in combination with these types of solutions containing HF as described above.

The third cleaning step provides the cleaning intended to make the top surface of the silicon wafer into a water repellent surface. This cleaning enabling the resultant water repellent surface also may include the cleaning with HF solution or BHF solution similar to the one used in the second cleaning. Again, $O_3$ water (ozone water) may be used in combination with these types of solutions containing HF as described above.

The sequence of performing the second cleaning step and the third cleaning step may not be limited. For example, possibly the first cleaning step may be performed, and then the second cleaning step (the cleaning of the back surface of the silicon wafer), followed by the third cleaning step (the cleaning of the top surface of the silicon wafer). Alternatively, the first cleaning step may be performed first, and then the third cleaning step (the cleaning of the top surface of the silicon wafer), followed by the second cleaning step (the cleaning of the back surface of the silicon wafer).

In the method for producing an epitaxial wafer according to the first invention, firstly the top and the back surfaces of the silicon wafer may be cleaned up by using the SC-1 liquid and the SC-2 liquid prior to the step of depositing, for example, an epitaxial film of silicon over the silicon wafer. Secondly, the cleaning is performed such that the back surface of the silicon wafer can turn to be the water repellent surface (the second cleaning step). Subsequently, the top surface of the silicon wafer is also cleaned such that it can turn to be the water repellent surface, as well (the third cleaning step). The second and the third cleaning steps may be performed inversely or simultaneously.

The second and the third cleaning steps may be applied to the top and the back surfaces of the silicon wafer, respectively, by using a single wafer processing type of cleaning equipment. Thus, the particles and metal impurities present on the top and the back surface of the silicon wafer can be successfully removed. This can help inhibit the stacking fault from being developed after the deposition of the epitaxial film on the top surface of the silicon wafer.

Further, making the back surface of the silicon wafer into water repellent surface can prevent any uneven etching, which would be otherwise observed locally in a native oxide film resultant from the $H_2$ gas baking prior to the epitaxial growth. Consequently, the native oxide film may have the uniform roughness entirely over the back surface of the silicon wafer, thus helping reduce the emergence of the cloud (the whity blur).

The second invention provides a method for producing an epitaxial wafer as defined in the first invention, wherein the second and the third cleaning steps are performed simultaneously.

In the method for producing an epitaxial wafer according to the second invention, the second and the third cleaning steps may be performed simultaneously. This can improve a throughput in the production of the epitaxial wafer.

To perform the second and the third cleaning steps simultaneously, a single wafer processing type of cleaning equipment may be used. The single wafer processing type of cleaning equipment may be provided with a cleaning fluid supply means enabling the cleaning fluid to be injected toward both the top and the back surfaces of the silicon wafer at the same time. Alternatively, single wafer processing type of cleaning equipment may be provided with an inverting mechanism allowing for the two sides of the silicon wafer to be inverted.

A third invention provides a method for producing an epitaxial wafer as defined in the first invention, wherein a contact angle of the water repellent surface is 30° or greater.

A fourth invention provides a method for producing an epitaxial wafer as defined in the second invention, wherein a contact angle of the water repellent surface is 30° or greater.

When a free surface of a static liquid such as water is in contact with a surface of silicon wafer, the contact angle is defined by an angle formed between the liquid surface and the surface of silicon wafer.

The contact angle may be determined as desired, so far as it is 30° or greater. A maximum contact angle may not be particularly limited.

In the method for producing an epitaxial wafer according to the third and the fourth invention, the top and the back surfaces of the silicon wafer may be treated so as to be the water repellent surfaces. The contact angle used in this process may be 30° or greater. This can help reduce a thickness of a native oxide film possibly formed on the top and the back surfaces of the silicon wafer to 10 Å (Angstrom) or thinner. Thus, the emergence of the cloud on the back surface of the silicon wafer as well as the stacking fault on the top surface of the silicon wafer can be reduced.

A fifth invention provides a method for producing an epitaxial wafer as defined in any one of the first to fourth invention, wherein the second and the third cleaning steps provide the cleaning by using at least either one of HF solution or BHF solution.

The second and the third cleaning steps may not be limited to the cleaning steps provided by using a combination of the HF solution or the BHF solution with purified water but may be provided by using a combination of either one of the solution with $O_3$ water.

In the method for producing an epitaxial wafer according to the fifth invention, the top and the back surfaces of the silicon wafer may be cleaned with the HF solution or the BHF solution. This can remove any native oxide film present in the top and the back surfaces of the silicon wafer to make both the top and the back surfaces water repellent. Thus, the emergence of the cloud on the back surface of the silicon wafer as well as the stacking fault on the top surface of the silicon wafer during the deposition of the epitaxial film can be reduced.

A sixth invention provides a method for producing an epitaxial wafer by depositing a film of epitaxial layer through the epitaxial growth over a top surface of a silicon wafer, comprising: a fourth cleaning step for cleaning a top and a back surfaces of the silicon wafer with a SC-1 liquid and a SC-2 liquid; a fifth cleaning step, after the fourth cleaning step, for cleaning the back surface of the silicon wafer to be a water repellent surface; and a sixth cleaning step for cleaning the top surface of the silicon wafer to be a hydrophilic surface, wherein after the three steps of cleaning having been finished, the film of epitaxial layer is deposited through the epitaxial growth over the top surface of the silicon wafer.

The fourth cleaning step, similarly to the first cleaning step as described above, may provide the cleaning step with the SC-1 liquid and the SC-2 liquid.

The fifth cleaning step, similarly to the second cleaning step as described above, may provide the cleaning to make the back surface of the silicon wafer into the water repellent surface.

The sixth cleaning step may provide the cleaning to make the top surface of the silicon wafer into the hydrophilic surface. This cleaning enabling the resultant hydrophilic surface also may include by way of example a combination of the cleaning by using a sponge brush with the cleaning with the purified water so that the Si surface can turn to be hydrophilic. Further, the type of cleaning used may not be limited but any type of cleaning may be employed so far as it can provide a resultant hydrophilic surface, including a combination of the HF solution with the purified water and the $O_3$ water.

It is to be noted that in one example, the fourth cleaning step may be performed first, and then the fifth cleaning step, followed by the sixth cleaning step. Alternatively, the fourth cleaning step may be performed first, and then the sixth cleaning step, followed by the fifth cleaning step.

In the method for producing an epitaxial wafer according to the sixth invention, the cleaning is applied to both the top and the back surfaces of the silicon wafer with the SC-1 liquid and the SC-2 liquid prior to the epitaxial film to grow.

In the cleaning, the back surface is cleaned to be water repellent (the fifth cleaning step). This cleaning can remove the native oxide film in the back surface of the silicon wafer and thus reduce the emergence of the cloud in the back surface of the silicon wafer, as well.

Further in the cleaning, the top surface is cleaned to be hydrophilic (the sixth cleaning step). This can inhibit any particles from being absorbed to the top surface of the silicon wafer and thus help reduce the emergence of any mounds developing from the particles.

Therefore, a resultant silicon wafer may be the one comprising the top surface and the back surface having different contact angle from each other.

A seventh invention provides a method for producing an epitaxial wafer as defined in the sixth invention, wherein the fifth and the sixth cleaning steps are performed simultaneously.

In the method for producing an epitaxial wafer according to the seventh invention, the fifth and the sixth cleaning steps maybe performed simultaneously. This can improve a throughput in the production of the epitaxial wafer.

To perform the fifth and the sixth cleaning steps simultaneously, a single wafer processing type of cleaning equipment may be used.

An eighth invention provides a method for producing an epitaxial wafer as defined in the sixth invention, wherein a contact angle of the hydrophilic surface is 20° or smaller and a contact angle of the water repellent surface is 30° or greater.

In the method for producing an epitaxial wafer according to the eighth invention, the cleaning is provided to make the top surface of the silicon wafer hydrophilic. This can help avoid the absorption of particles to the top surface of the silicon wafer more effectively. Thus, the emergence of any mounds developing from the particles can be reduced.

The contact angle of the hydrophilic surface may be 20° or smaller. A maximum contact angle of the water repellent surface may not be particularly limited so far as it is 30° or greater.

A ninth invention provides a method for producing an epitaxial wafer as defined in the seventh invention, wherein a contact angle of the hydrophilic surface is 20° or smaller and a contact angle of the water repellent surface is 30° or greater.

In the method for producing an epitaxial wafer according to the ninth invention, the cleaning is provided to make the top surface of the silicon wafer hydrophilic. This can help avoid the absorption of particles to the top surface of the silicon wafer more effectively. Thus, the emergence of any cloud (the whity blur) resultant from the formation of native oxide film can be reduced.

A tenth invention provides a method for producing an epitaxial wafer as defined in any of the sixth to ninth invention, wherein the sixth cleaning step provides a cleaning by a combination of a cleaning by using a sponge brush with a cleaning with a purified water The sponge brush refers to a brush comprising a brushing material planted in a handle of the brush, which is made of sponge.

In the method for producing an epitaxial wafer according to the tenth invention the cleaning provided by using the sponge brush while supplying the purified water can remove the particles but the native oxide film that would be left as it is in the top surface of the silicon wafer. This makes the top surface of the silicon wafer hydrophilic. The top surface of the silicon wafer that has been modified and now is hydrophilic tends not to allow any particles to be absorbed thereto. This can reduce the emergence of any mounds upon deposition of the epitaxial film.

An eleventh invention provides an epitaxial wafer with a film of epitaxial layer deposited through an epitaxial growth over a top surface of a silicon wafer, said wafer being produced by a method comprising the steps of: cleaning a top and a back surfaces of the silicon wafer by using a SC-1 liquid and a SC-2 liquid; subsequently processing the back surface of the silicon wafer into a water repellent surface; further processing the top surface of the silicon wafer into a water repellent surface; and then depositing the film of epitaxial layer through the epitaxial growth over the top surface of the silicon wafer. The epitaxial film may be a film made of silicon that has grown epitaxially, for example. Further, after the cleaning of both the top and the back surfaces of the silicon wafer, the back surface of the silicon wafer may be further treated to be the water repellent surface. Furthermore, both steps of process may be performed simultaneously.

A twelfth invention provides an epitaxial wafer with a film of epitaxial layer deposited through an epitaxial growth over a top surface of a silicon wafer, said wafer being produced by a method comprising the steps of: cleaning a top and a back surfaces of the silicon wafer by using a SC-1 liquid and a SC-2 liquid; subsequently processing the back surface of the silicon wafer into a water repellent surface; further processing the top surface of the silicon wafer into a hydrophilic surface; and then depositing the film of epitaxial layer through the epitaxial growth over the top surface of the silicon wafer. For example, the epitaxial film may be a film made of silicon through the epitaxial growth.

Effect Of The Invention

According to the respective aspects of the inventions as described above, the cleaning is provided to the top surface of the silicon wafer to make it water repellent, prior to the step of depositing the film of epitaxial film over the top surface of the silicon wafer. The cleaning is further provided to the back surface of the silicon wafer to make it water repellent, as well. This can reduce the stacking fault, which could otherwise emerge on the top surface of the silicon wafer after the deposition of the epitaxial film. In addition, this can also reduce the cloud, which could otherwise emerge on the back surface of the silicon wafer.

Alternatively, prior to the deposition of the epitaxial film over the top surface of the silicon wafer, the cleaning is provided to the top surface of the silicon wafer to make it hydrophilic. Further, the back surface of the silicon wafer undergoes the cleaning intended to make it hydrophilic. This can reduce the mounds, which could otherwise emerge on the top surface of the silicon wafer after the deposition of the epitaxial film of silicon. Further advantageously, the cloud can be reduced as well, which could otherwise emerge on the back surface of the silicon wafer. In addition, the resultant wafer is the silicon wafer comprising the top and the back surfaces having different contact angle from each other, or the top surface having modified to be hydrophilic and the back surface having modified to be water repellent.

DESCRIPTION OF REFERENCE NUMERAL

11 Silicon wafer,
13 Sponge brush,
14, 16 Purified water supply pipe, and
15, 17 HF solution supply pipe

DESCRIPTION OF THE PREFERRED EMBODIMENTS

One embodiment of the present invention will now be described with reference to the attached drawings, FIGS. 1 to 4.

First Embodiment

Now, the first embodiment of the present invention will be explained with reference to FIGS. 1 and 2.

The description provided herein is intended to explain a method for producing an epitaxial wafer, wherein after cleaning having been provided such that a top surface of a silicon wafer is made to be water repellent and a back surface of the silicon wafer is made to be water repellent, as well, an epitaxial film is deposited through an epitaxial growth. The method for producing the epitaxial wafer according to this illustrated embodiment is carried out in accordance with the flow chart as shown in FIG. 1.

Figure 1:
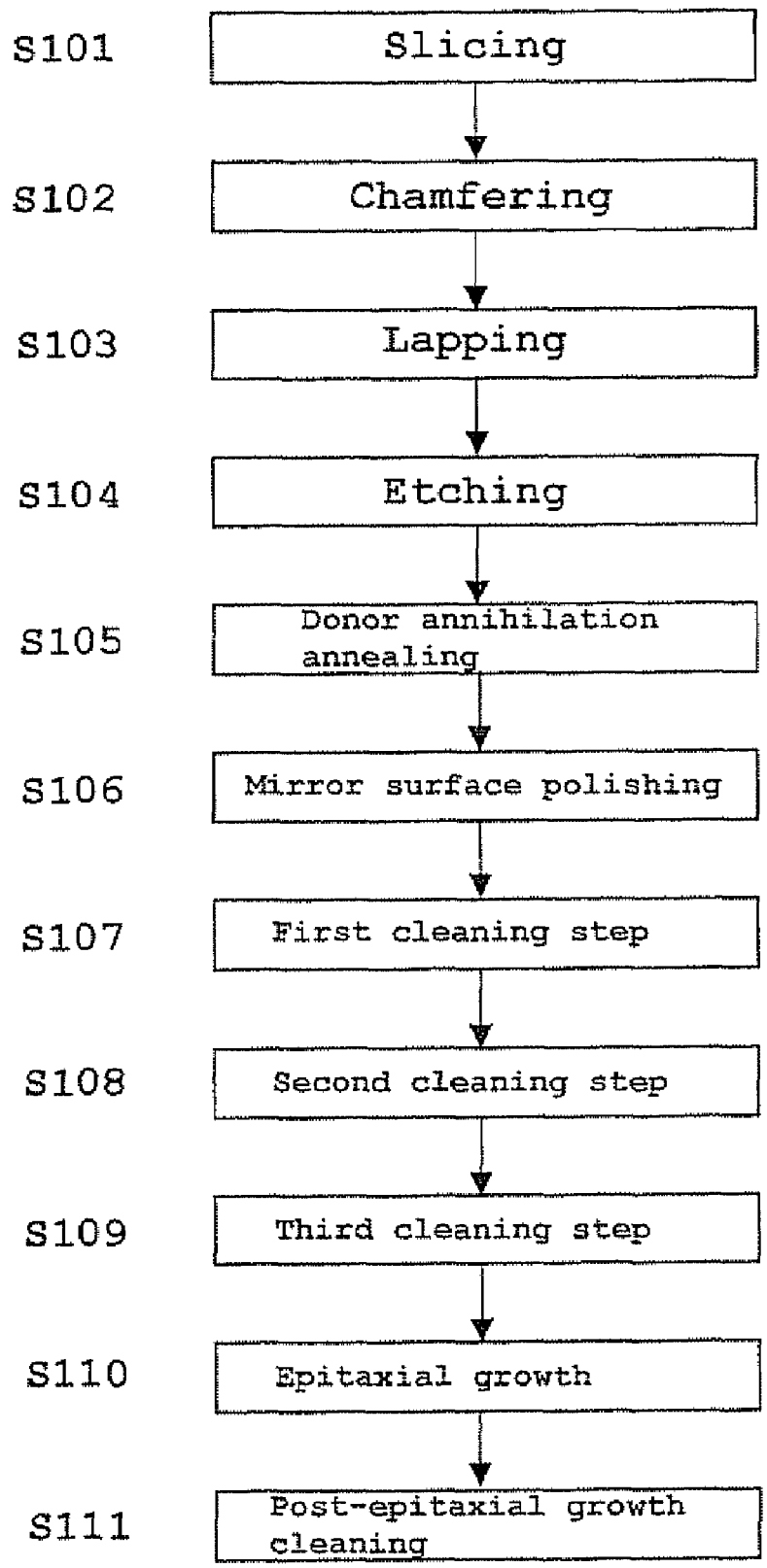
FIG. 1 is a flow chart showing a method for producing an epitaxial wafer according to a first embodiment of the present invention.

Firstly, a silicon wafer of eight-inch gauge is prepared as shown in step S101 of FIG. 1, which has been sliced from an ingot of silicon grown in the CZ (Czochralski) method.

Then, the sliced silicon wafer has its peripheral region to be chamfered into a desired shape by using a grinding wheel specialized for chamfering, as shown in step S102 of FIG. 1. As a result, the peripheral portion of the silicon wafer has a round shape as desired in section view.

In a subsequent lapping step as shown in step S103, the lapping process is applied to the chamfered wafer by means of a lapping-machine.

Then, in a subsequent etching step as shown in step S104 of FIG. 1, the lapped wafer is dipped in an etching solution (a mixed acid or an alkali+mixed acid) to thereby remove any distortions from the lapping process or the chamfering process. In this embodiment, the etching may be carried out typically by about 20 μm for one-side and about 40 μm for both-side.

After that, as shown in step S105 of FIG. 1, a thermal treatment for donor annihilation may be applied to the silicon wafer, if needed.

This silicon wafer is then mirror polished in both the top and back surfaces of the silicon wafer 11 by using a double side polishing method, as shown in step S106 of FIG. 1.

A series of a first cleaning step, a second cleaning step and a third cleaning step as shown in step S107 to step S109 of FIG. 1 is then performed sequentially.

It is now allowed, after the step S109, for an epitaxial film to grow on the planarized top surface of the silicon wafer, as shown in step S110 of FIG. 1. Specifically, trichlorosilane of a source gas along with $H_2$ gas of a carrier gas and any dopant gas, if needed, are introduced into a reaction furnace, where the silicon generated via the heat decomposition or reduction of the source gas is made to grow at a reaction rate of 0.5-6.0 μm/min on the silicon wafer that has been heated to a high temperature in a range of 1000-1200° C.

Finally, a post-treatment cleaning step subsequent to the epitaxial growth is performed, as shown in step S111 of FIG. 1. Specifically, this cleaning step is substantially same as the first cleaning step performed before the epitaxial growth, which may be provided by the RCA cleaning (the cleaning by using the SC-1 liquid and the SC-2 liquid).

The production of the epitaxial wafer is completed through the respective steps as described above.

The second and the third cleaning steps will now be described in detail with reference to FIG. 2.

The first cleaning step includes the two-step of cleaning of the top and the back surfaces of the silicon wafer firstly with the SC-1 liquid (the alkaline cleaning) and secondly with the SC-2 liquid (the acidic cleaning).

The SC-1 liquid is prepared to contain a mixture of an aqueous ammonia solution, a hydrogen peroxide solution and water by a ratio (volumetric ratio) of the aqueous ammonia solution: the hydrogen peroxide solution: the water=1:5:50, and used at a temperature in a range of 50° to 85° for the cleaning. The SC-1 cleaning can remove the particles adhering to the top and the back surface of the silicon wafer.

On the other hand, the SC-2 liquid is prepared to contain a mixture of an aqueous hydrochloric acid solution, a hydrogen peroxide solution and water by a ratio (volumetric ratio) of the aqueous hydrochloric acid solution: the hydrogen peroxide solution: the water=1:1:100 to 1:1:5, and used in a temperature range from an ambient temperature (a room temperature) to 70° for the cleaning. The SC-2 cleaning can remove the metal impurities adhering to the top and the back surface of the silicon wafer.

Figure 2:
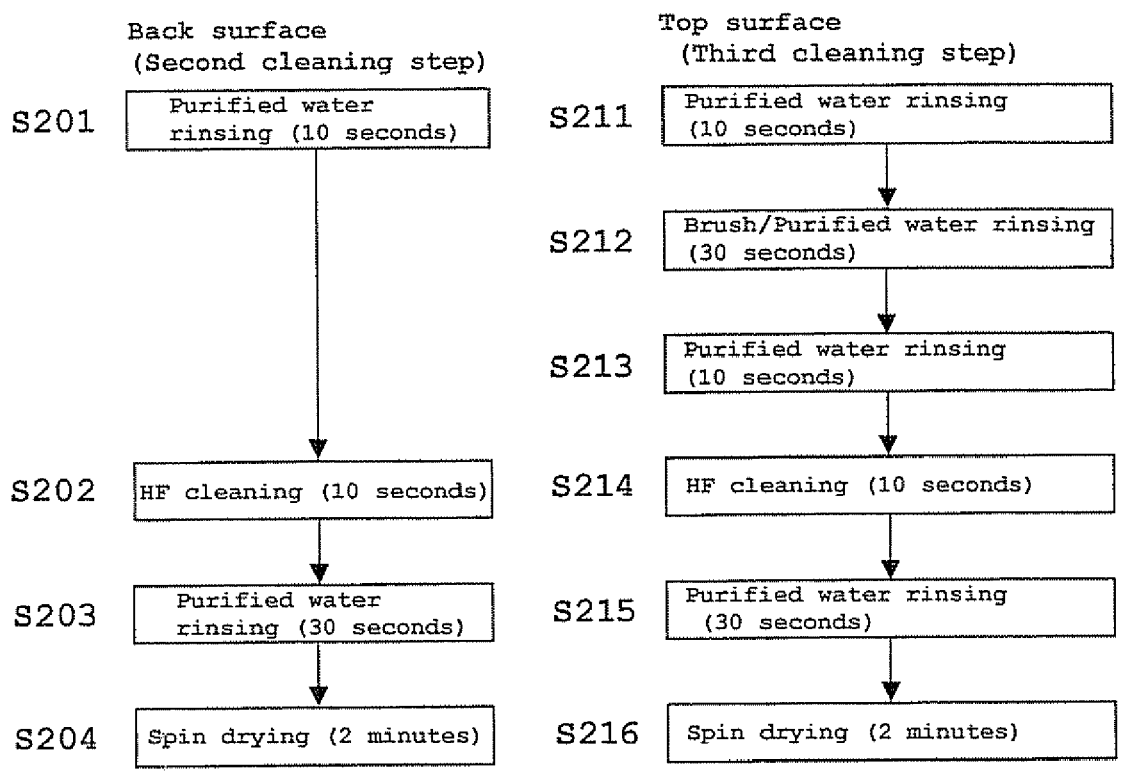
FIG. 2 is a flow chart showing a detailed procedure of the cleaning in the method for producing an epitaxial wafer shown in FIG. 1.

Then, the second and the third cleaning steps may be performed over the top and the back surface of the silicon wafer, as shown in FIG. 2. Those steps may be performed by using a single wafer processing type of cleaning equipment as shown in FIG. 5.

Figure 5:
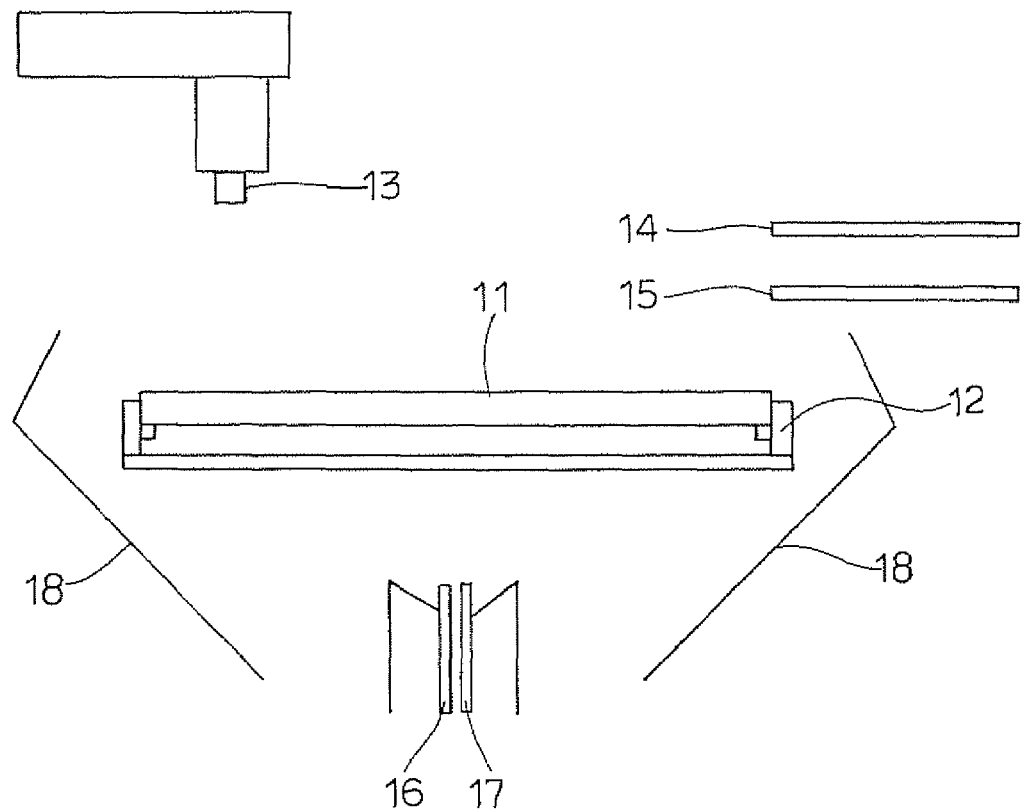
FIG. 5 is a side elevational view showing a part of a configuration of a single wafer processing type of cleaning equipment in the method for producing an epitaxial wafer according to the first and the second embodiments of the present invention.

The single wafer processing type of cleaning equipment as shown in FIG. 5 comprises a sponge brush 13 for applying a brush cleaning to the top surface of the silicon wafer 11, a purified water supply pipe 14, 16 for supplying the purified water to the top or the back surface of the silicon wafer 11, an HF solution supply pipe 15, 17 for supplying the HF solution to the top or the back surface of the silicon wafer 11, and so on. The cleaning equipment further comprises an edge chuck 12 for fixedly holding an edge portion of the silicon wafer. A vacuum chuck method, if employed, could make the back surface dirty during sucking being applied to the back surface of the silicon wafer. In contrast, using the edge chuck 12, in which the contact area with the chuck is limited to the edge portion of the silicon wafer 11, would never contaminate either the top or the back surface of the silicon wafer 11. In addition, a cover 18 is disposed around the silicon wafer 11.

The second cleaning step applied onto the back surface of the silicon wafer 11 will now be described in detail.

Firstly, the silicon wafer 11 is placed in the single wafer processing type of cleaning equipment and fixedly held therein by the edge chuck 12 as illustrated in FIG. 5. Then, a jet of purified wafer is ejected from the purified water supply pipe 16 over the back surface of the silicon wafer 11 for rinsing it with the purified water for 10 seconds, as shown in step S201 of FIG. 2

Subsequently, a jet of HF solution is ejected from the HP solution supply pipe 17 over the back surface of the silicon wafer 11 for cleaning it with the 3 wt % HF solution at 20° C., as shown in step S202 of FIG. 2.

After that, the jet of purified water is ejected from the purified water supply pipe 16 over the back surface of the silicon wafer 11 for rinsing it with the purified water for another 30 seconds, as shown in step S203 of FIG. 2.

Finally, the silicon wafer 11 is spin-dried in the back surface thereof, as shown in step S204 of FIG. 2, to thereby complete the second cleaning step.

As described above, the second cleaning step can modify the back surface of the silicon wafer 11 to be water repellent. In this regard, the contact angle of the water repellent surface (the back surface) is 30° or greater.

The third cleaning step applied onto the top surface of the silicon wafer 11 will now be described in detail.

Firstly, a jet of purified wafer is ejected from the purified water supply pipe 14 over the top surface of the silicon wafer 11 set in the single wafer processing type of cleaning equipment for rinsing it with the purified water for 10 seconds, as shown in step S211 of FIG. 2

Subsequently, a jet of purified water is ejected from the purified water supply pipe 14 over the top surface of the silicon wafer 11 for rinsing it with the purified water for another 30 seconds, as shown in step S212 of FIG. 2. In this process, the top surface of the silicon wafer 11 is rinsed with the purified water, while being scrubbed with the sponge brush 13.

After that, the jet of purified water is ejected from the purified water supply pipe 14 over the top surface of the silicon wafer 11 for rinsing it for another 10 seconds, as shown in step S213 of FIG. 2. In this process, the sponge brush 13 is not used but the rinsing with the purified water is provided.

Further, a jet of HF solution is ejected from the HF solution supply pipe 15 over the top surface of the silicon wafer 11 for cleaning it with the 3 wt % HF solution at 20° C., as shown in step S214 of FIG. 2.

In addition, the jet of purified water is ejected from the purified water supply pipe 14 over the top surface of the silicon wafer 11 for rinsing it with the purified water for another 30 seconds, as shown in step S215 of FIG. 2.

Finally, the silicon wafer 11 is spin-dried in the top surface thereof for two minutes, as shown in step S216 of FIG. 2, to thereby complete the third cleaning step.

The third cleaning step can modify the top surface of the silicon wafer 11 to be water repellent, as well. In this regard, the contact angle of the water repellent surface (the top surface) is 30° or greater.

If the single wafer processing type of cleaning equipment as shown in FIG. 5 is used, the second and the third cleaning steps as described above can be performed simultaneously. If the second and the third cleaning steps are carried out at the same time, the throughput in the production of the epitaxial wafer can be improved.

It may be further contemplated that a mechanism for inverting the two sides of the silicon wafer 11 may be additionally provided within the cleaning equipment. This can accommodate the cleaning of the silicon wafer 11 when it has the two sides inverted. Further, such a modification may be made possible, in which the third cleaning step may be followed by the second cleaning step.

A series of the first to the third cleaning steps can successfully remove the particles and the metal impurities on the top and the back surfaces of the silicon wafers 11, while at the same time making both the top and the back surfaces water repellent. The resultant water repellent surfaces of the silicon wafer 11 can produce lesser native oxide film. The thickness of the native oxide film present at this time would be 10 Å or thinner. When the film of epitaxial layer is deposited in this condition through the epitaxial growth over the top surface of the silicon wafer 11, the stacking fault can be reduced, which would otherwise emerge on the top surface of the silicon wafer 11. In addition, the cloud (the whity blur) can be reduced, which would otherwise emerge on the back surface of the silicon wafer 11.

A report will now be made on a result from an experiment on an epitaxial wafer produced in the production method as described above.

The report includes a defect evaluation on the top and the back surfaces of an epitaxial wafer that has been produced via a series of step S101 to step S111 of FIG. 1 in comparison to an epitaxial wafer that has been produced in the prior art process without applying the second and the third cleaning steps. The result is shown in Table 1.

It is to be noted that the number of particles, the number of mound defects and the number of stacking faults shown in Table 1 were determined, respectively, from the measurement on the numbers on 25 sheets of silicon wafers 11, wherein the total value for each type of defect from the measurements was divided by 25 to determine the averaged value for a sheet of wafer shown in Table 1. The number of particles was measured by using a SP-1 (a particle counter) with a threshold value set at 0.1 μm. The number of mound defects, the number of stacking faults as well as cloud were measured by using the SP-1.

TABLE 1

| | Contact angle | | Number of particles | | Number of mound defects | Number of stacking fault | Blur |
|---|---|---|---|---|---|---|---|
| | Top | Back | Top | Back | Top | Top | Back |
| 1$^{st}$ Embodiment | 63° | 65° | 8 | 13 | 0.9 | 0.1 | 0.16 ppm |
| Prior art | 11° | 11° | 21 | 30 | 3.2 | 8.4 | 0.92 ppm |

It has turned out apparent from the result of the experiment on the method for producing an epitaxial wafer of the present invention that the number of particles and the number of stacking faults in the top surface of the silicon wafer 11 can be successfully reduced. It has become obvious that the emergence of cloud in the back surface side of the silicon wafer 11 can be reduced, as well.

Second Embodiment

The second embodiment will now be described with reference to FIG. 3 and FIG. 4.

The method for producing an epitaxial wafer according to the illustrated embodiment is a modification of the method for producing an epitaxial wafer according to the first embodiment as explained above, which includes the following aspect. That is, in the illustrated embodiment, the top surface of the silicon wafer 11 has been cleaned to make it hydrophilic, prior to the deposition of the epitaxial film.

Figure 3:
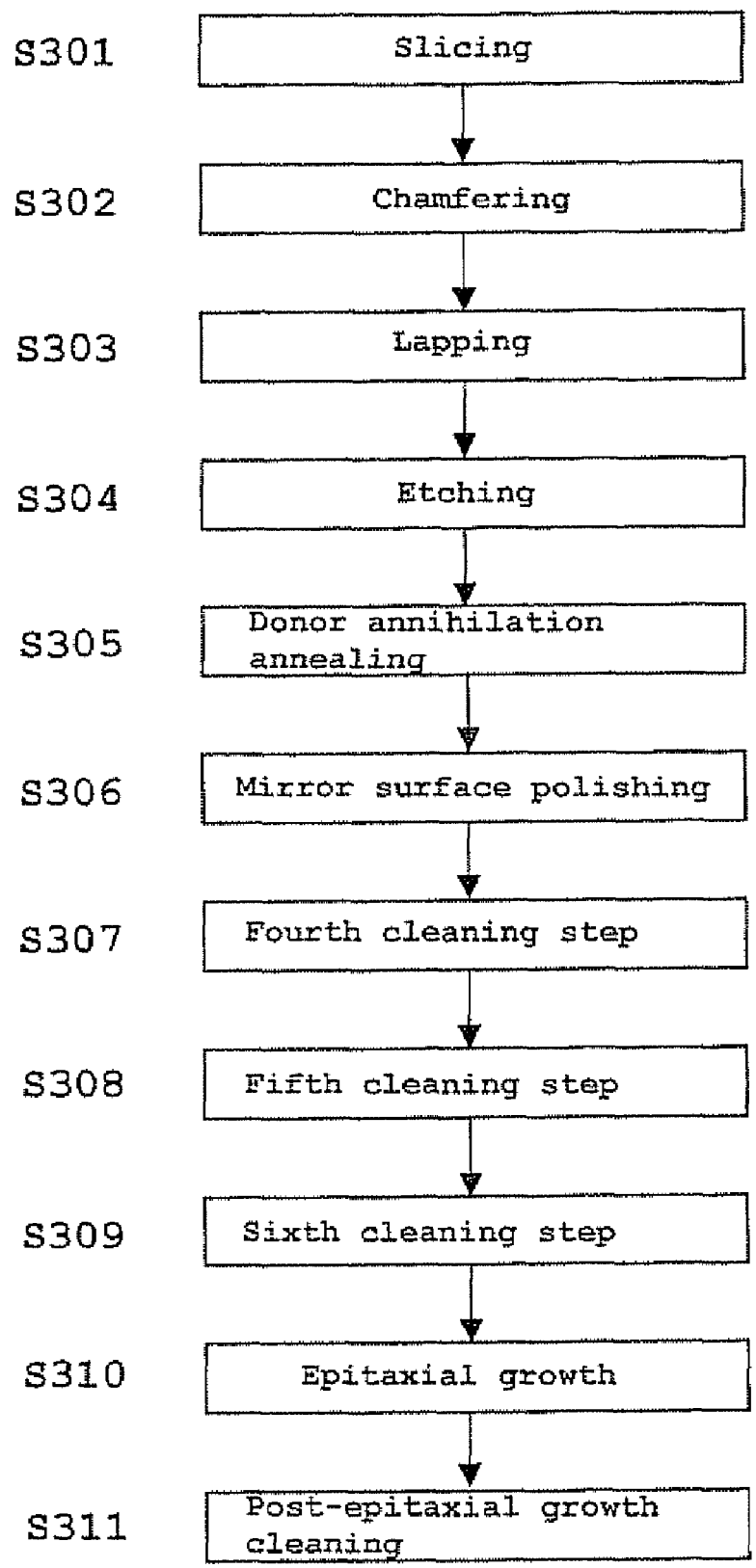
FIG. 3 is a flow chart showing a method for producing an epitaxial wafer according to a second embodiment of the present invention.

Specifically, a series of cleaning steps as designated in step S301 to step S306 of FIG. 3, which are identical to the corresponding steps in the above-described first embodiment, is carried out. After the series of above steps, a fourth cleaning step, a fifth cleaning step and a sixth cleaning step are performed sequentially as shown in step S307 to step S309 of FIG. 3. The fourth cleaning step is substantially identical to the first cleaning step in the first embodiment described above. Subsequently, the fifth cleaning step is applied to the back surface of the silicon wafer 11. It is to be noted that the fifth cleaning step (step S401 to step S404 shown in FIG. 4) is substantially identical to the second cleaning step in the first embodiment described above (step S201 to step S204 shown in FIG. 2). After that, the sixth cleaning step is performed on the top surface of the silicon wafer 11, which will be explained later.

After the sixth cleaning step, the epitaxial film is grown over the top surface of the silicon wafer 11 as shown in step S310 of FIG. 3. Finally, a post-treatment cleaning step subsequent to the epitaxial growth is performed, as shown in step S311 of FIG. 3, to thereby complete the production of the epitaxial wafer.

The sixth cleaning step on the top surface of the silicon wafer 11 will now be described in detail.

Figure 4:
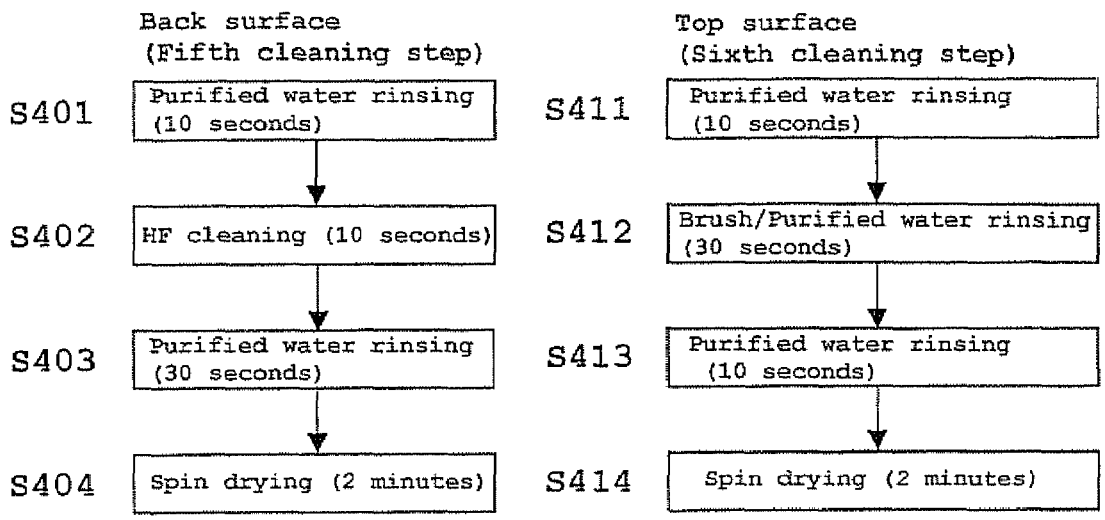
FIG. 4 is a flow chart showing a detailed procedure of the cleaning in the method for producing an epitaxial wafer shown in FIG. 3.

Firstly, the top surface of the silicon wafer 11 set in the single wafer processing type of cleaning equipment as shown in FIG. 5 is rinsed with the purified water for 10 seconds, as shown in step S411 of FIG. 4.

Subsequently, a jet of purified wafer is ejected from the purified water supply pipe 14 over the top surface of the silicon wafer 11 to rinse it for another 30 seconds, as shown in step S412 of FIG. 4. In this process, the top surface of the silicon wafer 11 is rinsed with the purified water, while being scrubbed with the sponge brush 13.

After that, the jet of purified water is ejected from the purified water supply pipe 14 over the top surface of the silicon wafer 11 to rinse it for another 10 seconds, as shown in step S413 of FIG. 4. In this operation, the top surface of the silicon wafer 11 is rinsed with the purified water without using the sponge brush 13.

Finally, the silicon wafer 11 is spin-dried in the top surface thereof, as shown in step S414 of FIG. 4, to thereby complete the cleaning step.

The sixth cleaning step can modify the top surface of the silicon wafer 11 to be hydrophilic. In this regard, the contact angle of the water hydrophilic surface (the top surface) is 20° or smaller.

A series of the fourth to the sixth cleaning steps can successfully remove the particles and the metal impurities on the top and the back surfaces of the silicon wafers 11, while at the same time making the top surface hydrophilic and the back surface water repellent. The resultant hydrophilic top surface of the silicon wafer 11 can inhibit any particles to be absorbed to the surface. Further, the resultant water repellent back surface can produce lesser native oxide film. The thickness of the native oxide film present at this time would be 10 Å or thinner.

When the film of epitaxial layer is deposited in this condition through the epitaxial growth over the top surface of the silicon wafer 11, the mounds can be reduced, which would otherwise develop from the particles on the top surface of the silicon wafer 11. In addition, the cloud can be reduced, which would otherwise emerge on the back surface of the silicon wafer 11.

A report will now be made on a result from an experiment on an epitaxial wafer produced in the production method as described above.

The report includes a defect evaluation on the top and the back surfaces of an epitaxial wafer that has been produced via a series of step S301 to step S311 of FIG. 3 in comparison to an epitaxial wafer that has been produced in the prior art process without applying the fifth and the sixth cleaning steps. The result is shown in Table 2.

It is to be noted that the condition of measurement is same as that in the first embodiment as described above.

TABLE 2

|  | Contact angle | | Number of particles | | Number of mound defects | Number of stacking fault | Blur |
| --- | --- | --- | --- | --- | --- | --- | --- |
|  | Top | Back | Top | Back | Top | Top | Back |
| 2$^{nd}$ Embodiment | 5° | 65° | 6 | 15 | 0.7 | 5.2 | 0.16 ppm |
| Prior art | 11° | 11° | 21 | 30 | 3.2 | 8.4 | 0.92 ppm |

It has turned out apparent from the result of the experiment on the method for producing an epitaxial wafer of the present invention that the number of particles and the number of mounds in the top surface of the silicon wafer 11 can be successfully reduced. It has become obvious that the emergence of cloud in the back surface side of the silicon wafer 11 can be reduced, as well.

What is claimed is:

1. A method for producing an epitaxial wafer by depositing a film of epitaxial layer through an epitaxial growth over a top surface of a silicon wafer, said method comprising:

cleaning a top surface and a back surface of a silicon wafer with a SC-1 liquid and a SC-2 liquid;

a hydrophobicating cleaning, after said SC-1 and SC-2 liquid cleaning, for cleaning said back surface of said silicon wafer to be a water repellent surface; and a hydrophilicating cleaning for cleaning said top surface of said silicon wafer to be a hydrophilic surface, wherein after said SC-1 and SC-2 liquid cleaning, said hydrophobicating cleaning, and said hydrophilicating cleaning are finished, a film of epitaxial layer is deposited through an epitaxial growth over said top surface of said silicon wafer, and wherein said hydrophobicating cleaning and said hydrophilicating cleaning are simultaneously performed.

2. The method for producing an epitaxial wafer in accordance with claim 1, in which a contact angle of said hydrophilic surface said top surface is 20° or smaller and a contact angle of said water repellent surface and said back surface is 30° or greater.

3. The method for producing an epitaxial wafer in accordance with claim 1, in which said hydrophilicating cleaning provides a cleaning by a combination of a sponge brush with a purified water.

4. The method for producing an epitaxial wafer in accordance with claim 1, in which said hydrophobicating cleaning is a cleaning using an HF solution or BHF solution.

5. The method for producing an epitaxial wafer in accordance with claim 2, in which said hydrophobicating cleaning is a cleaning using an HF solution or BHF solution.

6. The method for producing an epitaxial wafer in accordance with claim 3, in which said hydrophobicating cleaning is a cleaning using an HF solution or BHF solution.

7. The method for producing an epitaxial wafer in accordance with claim 2, in which said hydrophilicating cleaning provides a cleaning by a combination of a sponge brush with a purified water.

8. The method for producing an epitaxial wafer in accordance with claim 7, in which said hydrophobicating cleaning is a cleaning using an HF solution or BHF solution.

* * * * *